(12) United States Patent
Katz et al.

(10) Patent No.: US 9,530,604 B2
(45) Date of Patent: Dec. 27, 2016

(54) METHOD FOR OPERATING A TRAVELING-WAVE TUBE MODULE

(71) Applicant: Tesat-Spacecom GmbH & Co. KG, Backnang (DE)

(72) Inventors: Hanspeter Katz, Stuttgart (DE); Gerhard Reinwald, Aspach (DE)

(73) Assignee: Tesat-Spacecom GmbH & Co. KG, Backnang (DE)

( * ) Notice: Subject to any disclaimer, the term of this patent is extended or adjusted under 35 U.S.C. 154(b) by 281 days.

(21) Appl. No.: 14/200,586

(22) Filed: Mar. 7, 2014

(65) Prior Publication Data

US 2014/0253230 A1      Sep. 11, 2014

(30) Foreign Application Priority Data

Mar. 8, 2013 (DE) ........................ 10 2013 003 904

(51) Int. Cl.
| | |
|---|---|
| *H01Q 11/12* | (2006.01) |
| *H01J 25/34* | (2006.01) |
| *H03F 3/189* | (2006.01) |
| *H03F 3/58* | (2006.01) |

(52) U.S. Cl.
CPC .............. *H01J 25/34* (2013.01); *H03F 3/189* (2013.01); *H03F 3/58* (2013.01)

(58) Field of Classification Search
CPC ................... H04W 4/001; H04Q 2213/13349; Y04S 20/222

USPC .................................. 455/427, 115.1, 127.2
See application file for complete search history.

(56) References Cited

U.S. PATENT DOCUMENTS

| | | | |
|---|---|---|---|
| 3,165,696 A | 1/1965 | Poole | |
| 5,500,621 A | 3/1996 | Katz et al. | |
| 8,427,058 B2 | 4/2013 | Lewis | |
| 2005/0078778 A1* | 4/2005 | Chen | ............................ 375/346 |
| 2012/0268203 A1* | 10/2012 | Cuignet et al. | ............... 330/127 |

FOREIGN PATENT DOCUMENTS

| | | |
|---|---|---|
| DE | 1 298 201 | 6/1969 |
| DE | 10 2007 062 277 A1 | 6/2008 |
| EP | 2 099 054 A2 | 9/2009 |
| EP | 2 445 103 A1 | 4/2012 |
| WO | WO 2006/065388 A1 | 6/2006 |

OTHER PUBLICATIONS

German-language European Search Report dated Jun. 16, 2014, with Statement of Relevancy (Four (4) pages).

* cited by examiner

*Primary Examiner* — Tu X Nguyen
(74) *Attorney, Agent, or Firm* — Crowell & Moring LLP

(57) ABSTRACT

A method for operating a traveling-wave tube module of a communication satellite involves receiving of a high-frequency signal from an antenna of the satellite and determining that the high-frequency signal is to be amplified. The cathode current of a traveling-wave tube is increased to a predetermined operating value if the high-frequency signal is to be amplified and the high-frequency signal is amplified by the traveling-wave tube.

8 Claims, 2 Drawing Sheets

METHOD FOR OPERATING A TRAVELING-WAVE TUBE MODULE

CROSS-REFERENCE TO RELATED APPLICATIONS

The present application claims priority under 35 U.S.C. §119 to German Patent Application No. 10 2013 003 904.5, filed Mar. 8, 2013, the entire disclosure of which is herein expressly incorporated by reference. This application is related to U.S. patent application Ser. No. 14/201,201, filed on even date herewith, entitled "Method for Operating an Amplifier Module of a Satellite," the entire disclosure of which is herein expressly incorporated by reference.

FIELD OF THE INVENTION

Exemplary embodiments of the present invention relate to a method for operating a traveling-wave tube module of a communication satellite.

BACKGROUND OF THE INVENTION

In satellites the power amplifiers used are primarily traveling-wave tube amplifiers (TWTA, Traveling-Wave Tube Amplifier), which are generally designed as traveling-wave tube modules. These comprise a traveling-wave tube, which primarily determines the high-frequency characteristics, and a power supply, which generates the supply voltages for the traveling-wave tubes; in addition, they can also comprise a telemetry and/or telecommand interface to the satellite, and a control. The traveling-wave tube module can be complemented with a preamplifier (also called a channel amplifier), which can also contain a linearizer. In this combination, the device is known as a high-frequency power module.

A traveling-wave tube amplifies a high-frequency signal by passing an electron beam by a conductor, usually helical in shape, through which the high-frequency signal flows. If the conductor and the electron beam are configured appropriately, energy can be transferred from the electron beam to the high-frequency signal.

In general, a traveling-wave tube is designed to be operated at or near saturation. To achieve the greatest possible efficiency, multi-stage collectors, among other things, are used with a plurality of collector elements or collector stages that recover the majority of the residual energy from the consumed electron beam. The goal here is to select the voltages of the collector stages such that the traveling-wave tube achieves the greatest possible efficiency at saturation. When a high-frequency input signal is applied, the cathode current is distributed more or less uniformly to the various collector stages, thus resulting in a distribution of the power loss to all of the collector stages.

During idle operation, when the traveling-wave tube is operated without control, the electron beam does not give off any energy and therefore fully strikes the last collector stage. As a result, all of the power loss is concentrated on the last stage of the collector. In order to keep the power loss at an acceptable level in this case, the voltage is not freely selectable at this stage and, in certain circumstances, must be set at a lower value that would be necessary for optimum efficiency. This stage is therefore sometimes operated near its thermal capacity.

Consideration is being given to adding an additional collector stage that makes it possible to operate the last stage at a lower voltage, and thus with less power loss when it is not being controlled, but without a drop in efficiency. However, this additional stage makes both the power supply and the traveling-wave tube more complex and hence heavier and more expensive.

SUMMARY OF THE INVENTION

Exemplary embodiments of the present invention are directed to a light and cost-effective traveling-wave tube module for a communication satellite.

One aspect of the invention relates to a method for operating a traveling-wave tube module of a communication satellite. The traveling-wave tube module can comprise a traveling-wave tube and a control for controlling the traveling-wave tube. It should be understood that the communication satellite can have a plurality of traveling-wave tube modules, each of which can be associated with a channel of the satellite.

According to one embodiment of the invention, the method comprises the following steps: receiving of a high-frequency signal from an antenna of the satellite; determining that the high-frequency signal is to be amplified; increasing of the cathode current of a traveling-wave tube to a predetermined operating value if the high-frequency signal is to be amplified; and amplifying the high-frequency signal with the traveling-wave tube. In other words, the traveling-wave tube can be switched between two operating modes (idle operation and amplifying operation) by adapting the cathode current to the operating mode.

According to one embodiment of the invention, the method comprises, alternatively or in addition, the following steps: determining that no high-frequency signal is to be amplified; reducing the cathode current to a predetermined idle value. Just as the cathode current is increased when switching from idle operation to amplifying operation, the cathode current can be reduced when switching from amplifying operation to idle operation.

In this way, the traveling-wave tube can be adjusted to optimum efficiency in both operating modes. That is, the level of the cathode current during idle operation and amplifying operation is selected such that the traveling-wave tube always operates at optimum efficiency.

For example, in idle operation, in order to set the power output, the cathode current is reduced to the extent that the power loss does not exceed an acceptable value and the last collector element in the collector can therefore be operated in a thermally safe range. As a rule, the power loss of the last collector element can be reduced to 50% in this way.

Even if the reduction of the idle current does not occur immediately when a high-frequency signal is no longer being applied, as a result of the thermal time constant of the collector there is enough time to change the operating mode.

A change in operating mode can also only be made (and is only necessary) when the operation without control, which is to say without a high-frequency signal to be amplified, lasts a commensurate amount of time.

According to one embodiment of the invention the cathode current is reduced to a value greater than zero. In other words, the idle value can be greater than zero, for example in order to accelerate a subsequent increase to the operating value.

To enable adaptation of the power output of the traveling-wave tube module, certain devices permit the use of a telecommand interface to reduce power output. In doing so, the cathode current can be reduced using a corresponding telecommand until the desired output level is reached. This function, which is already present in a traveling-wave tube module, can also be used to switch the cathode current from an idle value to an operating value and vice versa.

According to one embodiment of the invention, the method further comprises the following step: receiving of a telecommand via an antenna of the satellite conveying that the high-frequency signal is to be amplified. For example, the telecommand is generated in a ground station and transmitted to the satellite from the ground station. At the ground station, it can be determined when the satellite is to amplify a high-frequency signal—for example, if the user of the satellite has booked broadcasting time or if there is an order to transmit a high-frequency signal.

According to one embodiment of the invention, the method further comprises the following step: detecting and analyzing a measured value or a parameter of the traveling-wave tube module, it being determined, on the basis of the measured value, that the high-frequency signal is to be amplified. It is also possible for the traveling-wave tube module to establish independently when the operating mode is to be changed.

According to one embodiment of the invention, the measured value is a power input of an input current of the traveling-wave tube module. In order to determine whether or not a high-frequency signal is currently being amplified, the control can monitor the input current of the traveling-wave tube module and determine the current power consumption of the traveling-wave tube module from this. It can be determined from time-peaks in the power whether a high-frequency signal is currently being amplified.

In particular, the DC peak input power of the traveling-wave tube module can be determined. If the power drops below a certain value that corresponds to non-controlling or idle operation, the cathode current is automatically reduced. If the peak input power rises again above a certain value, the cathode current is again set to the value before the reduction and thus switched to amplifying operation. Through an appropriate time constant, the reduction of the cathode current can only occur when the detected idle operation exceeds a certain duration (a predetermined duration, for example).

According to one embodiment of the invention, the measured value is an output of the high-frequency signal. Alternatively or in addition, the control of the traveling-wave tube module can monitor the (unamplified) high-frequency signal directly. For example, the HF peak input power can be measured via a preamplifier of the traveling-wave tube module, and the change in the cathode current can be controlled accordingly based on that value.

According to one embodiment of the invention, the measured value is detected over a time period an analysis is performed as to whether at least one peak value of the measured value lies above a threshold within the time period in order to determine that the high-frequency signal is to be amplified. As already pointed out, the measured value can be an input power of the power supply of the traveling-wave tube module and/or an input power of the high-frequency signal. Whenever peak values of the input power rise above a certain threshold, it can be assumed that amplifying operation is progress.

Conversely, the measured value can be detected over a time period and an analysis can be performed as to whether no peak value lies below the threshold during the time period in order to determine that the high-frequency signal is not (or no longer) to be amplified. For example, if a peak value is no longer detected in the input power for a certain duration that lies above the threshold, it can be assumed that idle operation is in progress.

According to one embodiment of the invention, the cathode current is reduced through a reduction in the anode voltage. For example, an appropriate nominal value (i.e., the idle value or operating value) can be indicated to a cathode current regulator of the traveling-wave tube module and set the cathode current accordingly via the anode voltage. The set range is generally 4 dB of the output power, which corresponds to about 50% of the cathode voltage.

Another aspect of the invention relates to a traveling-wave tube module. It should be understood that features of the traveling-wave tube module can also be features of the method, and vice versa.

According to one embodiment of the invention, the traveling-wave tube module comprises a traveling-wave tube and a control for controlling the traveling-wave tube.

The traveling-wave tube comprises an emitter designed to generate an electron beam upon application of a voltage; an amplifier section through which the electron beam passes and in which a conductor is arranged in which a high-frequency signal passing through the conductor can be amplified by the electron beam; and a collector designed to absorb the electron beam, thus creating a cathode current. The collector comprises a plurality of collector elements designed to absorb a respective portion of the electron beam when the traveling-wave tube is in amplifying operation. During idle operation in which no high-frequency signal is being amplified, the electron beam merely strikes a last collector element, which absorbs the entire cathode current in this case. Through the reduction of the cathode current during idle operation, the load on the last collector element can be reduced.

The control of the traveling-wave tube module is designed to adjust the cathode current. Moreover, the control can determine that the high-frequency signal is to be amplified in order to increase the cathode current to a predetermined operating value in response to that. For example, the control can increase the anode current to the extent that a certain operating value is reached for the cathode current. Conversely, the control can also determine that the amplifying operation is to be ended and then reduce the cathode current to an idle value, for example by reducing the anode voltage to a certain idle value.

According to one embodiment of the invention, the control is designed to receive a telecommand that instructs the control to amplify the high-frequency signal. For example, a telecommand module of the control can receive and analyze a corresponding telecommand.

According to one embodiment of the invention, the control is designed to analyze a measured value of the traveling-wave tube module in order to determine that a high-frequency signal is to be amplified. This measured value can, for example, be an input current of the traveling-wave tube module from a power supply of the satellite.

Below, exemplary embodiments of the invention are described in detail with reference to the enclosed figures.

BRIEF DESCRIPTION OF THE FIGURES

As a matter of principle, identical or similar parts are provided with the same reference symbols.

DETAILED DESCRIPTION OF EXEMPLARY EMBODIMENTS

Figure 1:
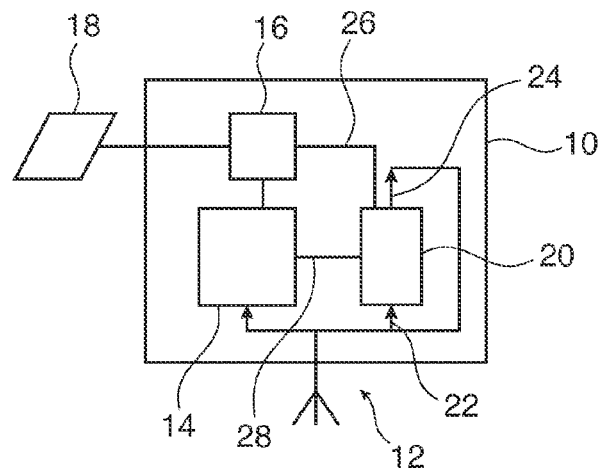
FIG. 1 shows a schematic view of a communication satellite according to one embodiment of the invention.

FIG. 1 shows a communication satellite 10 with an antenna 12, a control unit 14 and a power supply 16, which is powered, for example, by a solar panel 18.

Furthermore, the communication satellite 10 has a traveling-wave tube module 20. FIG. 1 only shows one channel of the communication satellite 10; as a rule, a communication satellite 10 can have several channels, each of which can comprise a traveling-wave tube module 20.

The communication satellite 10 can receive a high-frequency signal 22 via the antenna 12 and forward it to the traveling-wave tube module 20. There, the high-frequency signal 22 is amplified into an amplified high-frequency signal 24 and can be emitted again via the antenna 12 (or another antenna). The traveling-wave tube module 20 is supplied with current 26 via the power supply 16. Furthermore, the traveling-wave tube module 20 can be controlled by the control unit 14 and receive telecommands 28, which are received via the antenna 12, for example, and analyzed by the control unit 14.

Figure 2:
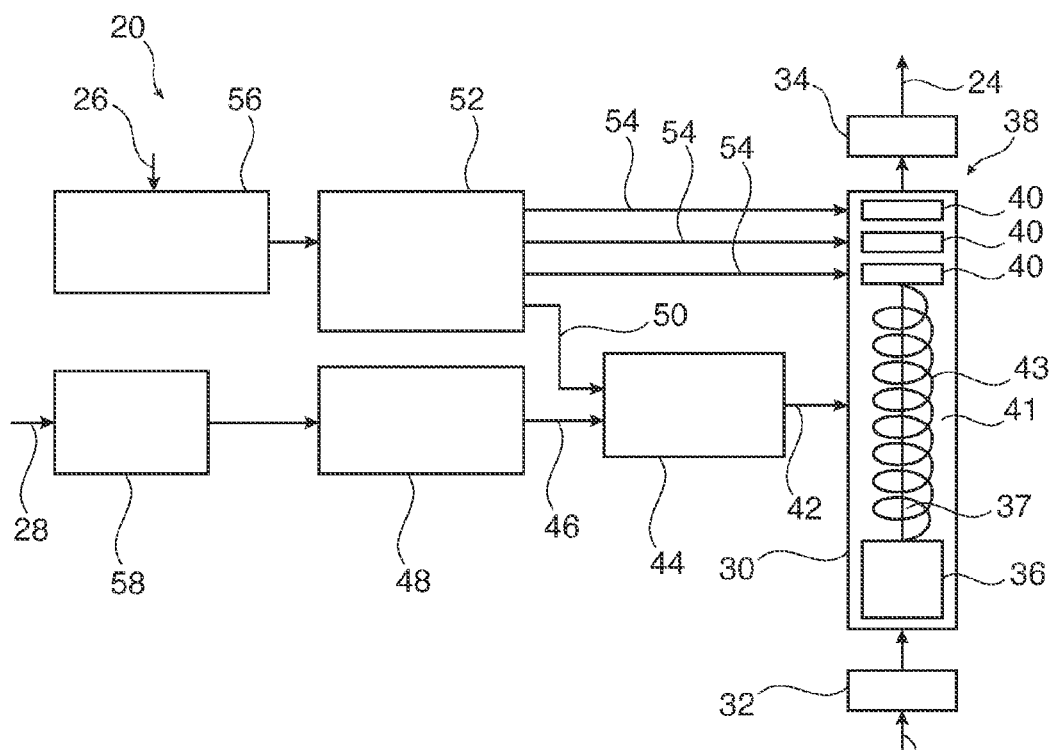
FIG. 2 shows a schematic view of a traveling-wave tube module according to one embodiment of the invention.

FIG. 2 shows a traveling-wave tube module 20 in more detail. The traveling-wave tube module 20 comprises a traveling-wave tube 30 that receives the high-frequency signal 22 via a high-frequency input 32 and outputs the amplified high-frequency signal 24 via a high-frequency output 34.

The traveling-wave tube 30 comprises an emitter 36 with which an electron beam 37 can be generated, and a collector 38 that absorbs the electron beam 37 again and has a plurality of collector elements 40 to which the electron beam 37 is divided in the amplifying operation of the traveling-wave tube 30. In this way, the current can be returned from the electron beam to the emitter 36. Located between the emitter and the collector 38 is an amplifier region 41 in which the high-frequency signal 22 is amplified by the electron beam. The high-frequency signal 22 is sent here through the traveling-wave tube 30 through a conductor 43.

The emitter 36 comprises a cathode for giving off the electrons and an anode that can be set to an anode voltage 42 in order to produce the electron beam 37. The intensity of the electron beam 37 is set via the anode voltage 42, which is generated by a cathode current regulator 44. The cathode current regulator 44 receives the corresponding value 46 for the cathode current from a control 48. A required voltage 50 is provided by a high-voltage generation 52.

The high-voltage generation 52, which also generates the voltages 54 that are applied to the collector elements 40, is supplied with current by a pre-regulator and filter 56 which concerts the current 26 from the power supply 16 of the satellite 10 into a constant and uniform direct current.

Furthermore, the traveling-wave tube module 20 can comprise a telecommand interface 58 which pre-processes the telecommands 28 for the control 48.

Figure 3:
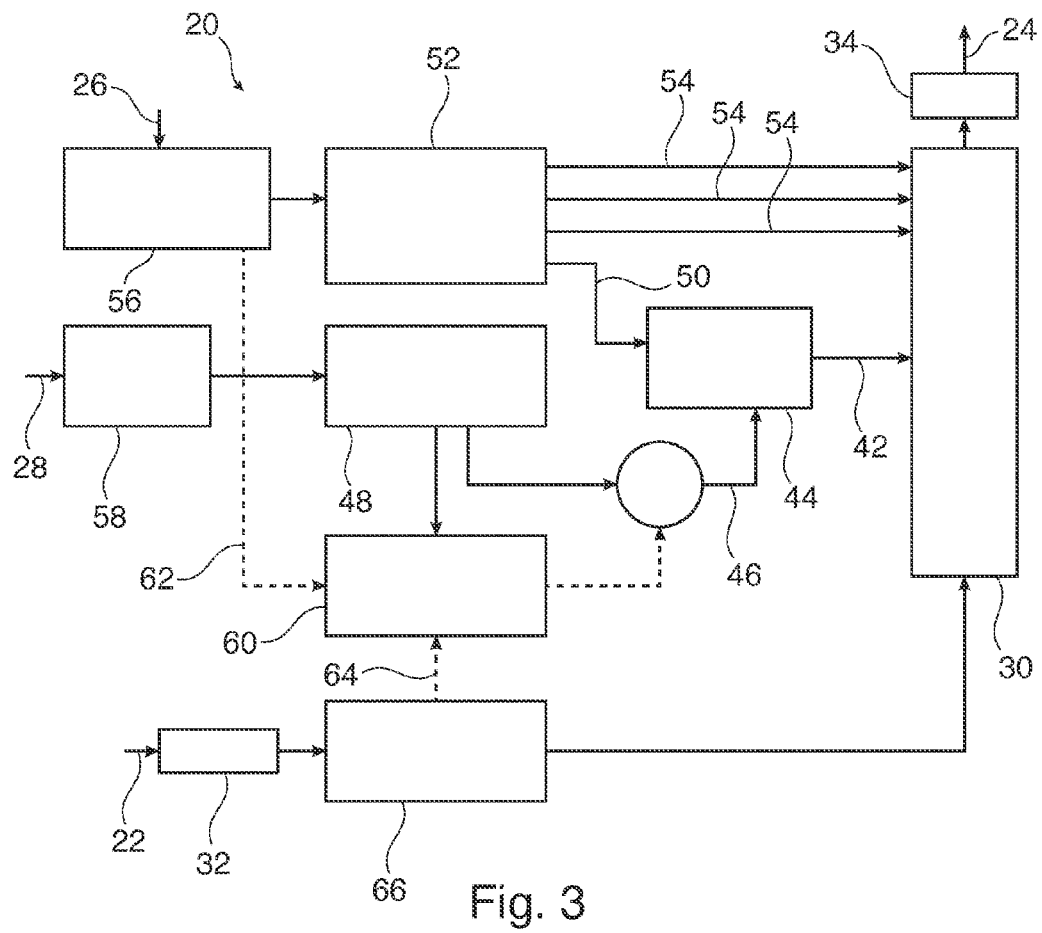
FIG. 3 shows a schematic view of a traveling-wave tube module according to another embodiment of the invention.

FIG. 3 shows a traveling-wave tube module 20 to which several components have been added as compared to FIG. 2. The control 48 comprises a control logic 60 that can monitor and analyze the input power 62 absorbed by the pre-regulator and filter 56. Alternatively or in addition, the control logic 60 can monitor and analyze the input power 64 the high-frequency signal 22. For example, the control logic 60 receives these values 64 from a channel amplifier and/or linearizer 66 with which the unamplified high-frequency signal 22 can be pre-amplified and/or linearized before it is fed to the traveling-wave tube 20.

From the detected values 62 and/or 64, the control logic determines the operating mode (amplifying operation or idle operation) the traveling-wave tube 30 is to be operated and adapts the set value 46 for the cathode current accordingly.

Figure 4:
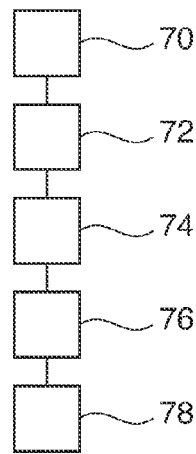
FIG. 4 shows a flowchart for a method for operating a traveling-wave tube module according to one embodiment of the invention.

FIG. 4 shows a flowchart with which the traveling-wave tube module 20 can be operated.

In the step 70, it is determined that the traveling-wave tube 30 is or should be controlled, which is to say that the traveling-wave tube 30 is to be operated in amplifying operation.

This can be done, for example, via an appropriate telecommand 28 received by the telecommand interface 58 and then analyzed appropriately by the control 48. The telecommand 28 can be transmitted, for example, from a base station to the satellite 10.

Alternatively or in addition, the traveling-wave tube module 20 can also determine independently that the traveling-wave tube 20 is being controlled. This can be done, for example, by detecting the values 62 and/or 64. Anytime peak values for these input power levels exceed a certain predetermined threshold, the control logic 60 assumes that the traveling-wave tube 39 is being controlled.

In the step 72, the cathode current is increased to a predetermined operating value 46. To do this, the operating value 36 to be reached is communicated to the cathode current regulator 44, for example by the control logic 60 or by the control 48, and the cathode current regulator 44 adjusts the anode current 42 accordingly.

In the step 74, the received high-frequency signal 22 is amplified by the traveling-wave tube 30 and then transmitted again by the satellite 10. In doing so, the traveling-wave tube 30 can achieve a high degree of efficiency, since the collector elements 40 and the collector voltages 54 are selected such that the greatest possible efficiency is achieved during amplifying operation.

In the step 76, it is determined that the traveling-wave tube is not being or should no longer be controlled. This can be done, analogously to the step 70, via a telecommand or through the detection of values within the satellite 10.

In the step 78, analogously to the step 72, the cathode current is again reduced to an idle value 46. Even though the electron beam is now only striking the last collector element 40 while in idle operation, the latter is not damaged or at least not greatly heated, since the cathode current has been reduced. In this way, the efficiency is increased in idle operation as well. Additional collector elements are not necessary.

In addition, it should be pointed out that "comprising" does not exclude any other elements or steps, and "a" does not exclude a plurality. Moreover, it should be noted that features or steps that have been described with reference to one of the above exemplary embodiments can also be used in combination with other features or steps of other exemplary embodiments described above. Reference symbols in the claims are not to be regarded as being restrictive.

The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

What is claimed is:

1. A method for operating a traveling-wave tube module of a communication satellite configured to operate in at least an idle mode and an amplifying mode, the method comprising the steps of:
   receiving a high-frequency signal from an antenna of the satellite;
   determining that the high-frequency signal is to be amplified;
   increasing a cathode current of a traveling-wave tube to a predetermined operating value if the high-frequency signal is to be amplified;
   detecting and analyzing a measured value of the traveling-wave tube module; and
   switching, based on the measured value, the traveling-wave tube module from the idle mode to the amplifying mode such that the high-frequency signal is amplified using the traveling-wave tube,
   wherein the measured value is detected over a time period, and the analysis involves determining whether at least one peak value of the measured value lies above a threshold in order to determine that the high-frequency signal is to be amplified.

2. The method of claim 1, further comprising the steps of:
   determining that no high-frequency signal is to be amplified; and
   reducing the cathode current to a predetermined idle value.

3. The method of claim 2, wherein the predetermined idle value to which the cathode current is reduced is a value greater than zero.

4. The method of claim 2, wherein the cathode current is reduced through reduction of an anode voltage.

5. The method of claim 1, wherein the measured value is a power input of an input current of the traveling-wave tube module.

6. The method of claim 1, wherein the measured value is an output of the high-frequency signal.

7. A traveling-wave tube module configured to operate in at least an idle mode and an amplifying mode, comprising:
   a traveling-wave tube; and
   a controller configured to control the traveling-wave tube, wherein the traveling-wave tube comprises:
      an emitter configured to generate an electron beam upon application of a voltage;
      an amplifier section through which the electron beam passes and in which is arranged a conductor in which a high-frequency signal passing through the conductor is amplified by the electron beam;
      a collector configured to absorb the electron beam, thus creating a cathode current, wherein the collector comprises a plurality of collector elements configured to absorb a respective portion of the electron beam when the traveling-wave tube is in amplifying operation;
   wherein the controller is configured to set the cathode current and to determine that the high-frequency signal is to be amplified in order to increase the cathode current to a predetermined operating value in response to the determination that the high-frequency signal is to be amplified,
   wherein the controller is configured to analyze a measured value of the traveling-wave tube module in order to determine whether or the traveling-wave tube module is to be switched from the idle mode to the amplifying mode such that the high-frequency signal is amplified using the traveling-wave tube, and
   wherein the controller is configured to detect the measured value of a time period, and the analysis involves determining whether at least one peak value of the measured value lies above a threshold in order to determine that the high-frequency signal is to be amplified.

8. The traveling-wave tube module of claim 7, wherein the controller is configured to receive a telecommand that instructs the control to amplify the high-frequency signal.

* * * * *